United States Patent [19]

Hatta

[11] Patent Number: 5,087,964
[45] Date of Patent: Feb. 11, 1992

[54] PACKAGE FOR A LIGHT-RESPONSIVE SEMICONDUCTOR CHIP

[75] Inventor: Muneo Hatta, Itami, Japan

[73] Assignee: Mitsubishi Denki Kabushiki Kaisha, Japan

[21] Appl. No.: 561,578

[22] Filed: Aug. 2, 1990

[30] Foreign Application Priority Data

Oct. 31, 1989 [JP] Japan .................. 1-285224

[51] Int. Cl.⁵ ............................. H01L 23/02
[52] U.S. Cl. ........................ 357/74; 357/72; 357/73
[58] Field of Search ............ 357/74, 72 E, 72, 73

[56] References Cited

U.S. PATENT DOCUMENTS

| | | | |
|---|---|---|---|
| 4,760,440 | 7/1988 | Bigler et al. | 357/74 |
| 4,873,566 | 10/1989 | Hokanson et al. | 357/74 |
| 4,879,588 | 11/1989 | Ohtsuka et al. | 357/74 |
| 4,891,686 | 1/1990 | Krausse, III | 357/74 |
| 4,953,001 | 8/1990 | Kaiser, Jr. et al. | 357/74 |
| 4,985,753 | 1/1991 | Fujioka et al. | 357/74 |
| 4,990,719 | 2/1991 | Wright | 357/74 |

FOREIGN PATENT DOCUMENTS

| | | |
|---|---|---|
| 54-146985 | 11/1979 | Japan . |
| 55-154753 | 12/1980 | Japan . |
| 56-24969 | 3/1981 | Japan ......... 357/74 |
| 60-154647 | 8/1985 | Japan ......... 357/74 |
| 61-150351 | 7/1986 | Japan ......... 357/74 |
| 62-224047 | 10/1987 | Japan . |
| 64-39047 | 2/1989 | Japan ......... 357/74 |
| 1-89546 | 4/1989 | Japan ......... 357/74 |
| 1-99244 | 4/1989 | Japan ......... 357/74 |
| 1-154569 | 6/1989 | Japan . |
| 1-201967 | 8/1989 | Japan ......... 357/74 |

OTHER PUBLICATIONS

IBM Technical Disclosure Bulletin, vol. 27, No. 3, Aug. 1984, "Hermetic Seal for Semiconductor Package" by Olah et al., p. 1701.

*Primary Examiner*—Rolf Hille
*Assistant Examiner*—Steven Loke
*Attorney, Agent, or Firm*—Leydig, Voit & Mayer

[57] ABSTRACT

A semiconductor device having a semiconductor chip packaged in a semiconductor container, which operates in receiving visible light, near infrared light and ultraviolet light, the semiconductor device includes a lower plate formed of a material which hardly transmits light with high insulation resistance and high mechanical intensity and has coefficient of linear expansion almost the same as that of the semiconductor chip, the semiconductor chip mounted on the lower plate, a middle plate comprising a single-layer or a multiple-layer wiring board, and an upper plate formed of a material which hardly transmits light with high insulation resistance and high mechanical intensity and has coefficient of linear expansion almost the same as that of the lower plate and having a window for incident light at one part thereof, in which the lower plate and the upper plate are bonded with putting the middle plate therebetween and an upper part of the upper plate is sealed by a lid formed of glass or a synthetic resin.

4 Claims, 11 Drawing Sheets

PACKAGE FOR A LIGHT-RESPONSIVE SEMICONDUCTOR CHIP

FIELD OF THE INVENTION

The present invention relates to a semiconductor device and more particularly to a package for a solid-state imaging device.

BACKGROUND OF THE INVENTION

FIG. 16 is a partially exploded perspective view showing a conventional semiconductor device and FIG. 17 is a sectional view showing the same. In FIG. 16, reference numeral 1 designates a multi-layer ceramic plate formed of alumina ($Al_2O_3$), reference numeral 2 designates an image sensor chip die bonded to a bottom surface of the multiple-layer ceramic plate 1, reference numeral 3 designates a wire which electrically connects a pad 4 on the chip to an inner lead 5 on the multi-layer ceramic plate 1, reference numeral 6 designates an outer lead electrically connected to said inner lead 5 by a multiple-layer wiring (not shown) in the multiple-layer ceramic plate, reference numeral 7 designates a light shielding plate preventing light from radiating to a part other than the image area 8, and reference numeral 9 designates a glass lid bonded to the multi-layer ceramic plate 1 by a resin.

Operation will be described hereinafter.

Incident light passes through the glass lid 9. Then, only light passing through an opening of the light shielding plate 7 reaches the image area 8 on the image sensor chip 2. Then, a light image is converted to an electric signal by a photo-electric effect. This electric signal is output to the outer lead 6 through the pad 4, the wire 3, the inner lead 5 and the multiple-layer wiring (not shown) of the multi-layer ceramic plate 1 made of alumina.

According to the thus formed conventional semiconductor device, when an image sensor chip made of silicon (coefficient of linear expansion $\alpha = 3.04 \times 10^{-6}$ $\{°K^{-1}\}$) is bonded to the multiple-layer ceramic plate made of alumina (coefficient of linear expansion $\alpha = 6.8 \times 10^{-6}$ $\{°K^{-1}\}$) using a thermosetting resin at approximately 150° C. and cooled to room temperature (25° C.), the semiconductor device is curved due to the difference between the coefficients of linear expansion of silicon and alumina. A curvature, which is convex when viewed with the silicon chip 2 positioned on the upper side, is generated. FIG. 18 is a graph showing the relation between curvature and the distance from the chip center. As shown in FIG. 18, when the chip has an overall length of 85 mm, a curvature of 200 μm is generated. Therefore, in the conventional semiconductor device, incident light from an optical system does not focus on the image area, so that the semiconductor device does not operate normally internal stress in the chip is high at room temperature, and reliability against heat cycling and the like is low.

SUMMARY OF THE INVENTION

The present invention was made in order to solve these problems and it is an object of the present invention to provide a semiconductor device in which the curvature of a chip surface is small, incident light from an optical system focuses on an image area, a chip can operate normally, internal stress of the chip is low and reliability against a heat cycle and the like is sufficiently high.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A semiconductor device in accordance with the present invention comprises a lower plate formed of a material which hardly transmits light, has high electrical resistance, high mechanical strength and a coefficient of thermal expansion almost the same as that of the semiconductor chip, a middle plate comprising a single-layer or a multiple-layer wiring board and an upper plate formed of a material which hardly transmits light, has high electrical resistance, high mechanical strength and a coefficient of thermal expansion almost the same as that of the lower plate and having a window for incident light. The upper and lower plates are bonded to each other and the upper plate is sealed by a lid formed of glass or a synthetic resin.

According to the present invention, since a lower plate and an upper plate of a semiconductor device are formed of a material which has high electrical resistance and high mechanical strength and a coefficient of thermal expansion almost the same as that of a semiconductor chip, and hardly transmit light, when they are bonded with a middle plate serving as a wiring board therebetween at a high temperature and then cooled to a room temperature (25° C.), the shrinkage force on both sides of the middle plate is the same so that curvature of the chip surface is reduced and internal stress of the chip is lowered.

DETAILED DESCRIPTION of PREFERRED EMBODIMENTS

An embodiment of the present invention will be described in detail with reference to the drawings.

Figure 1:
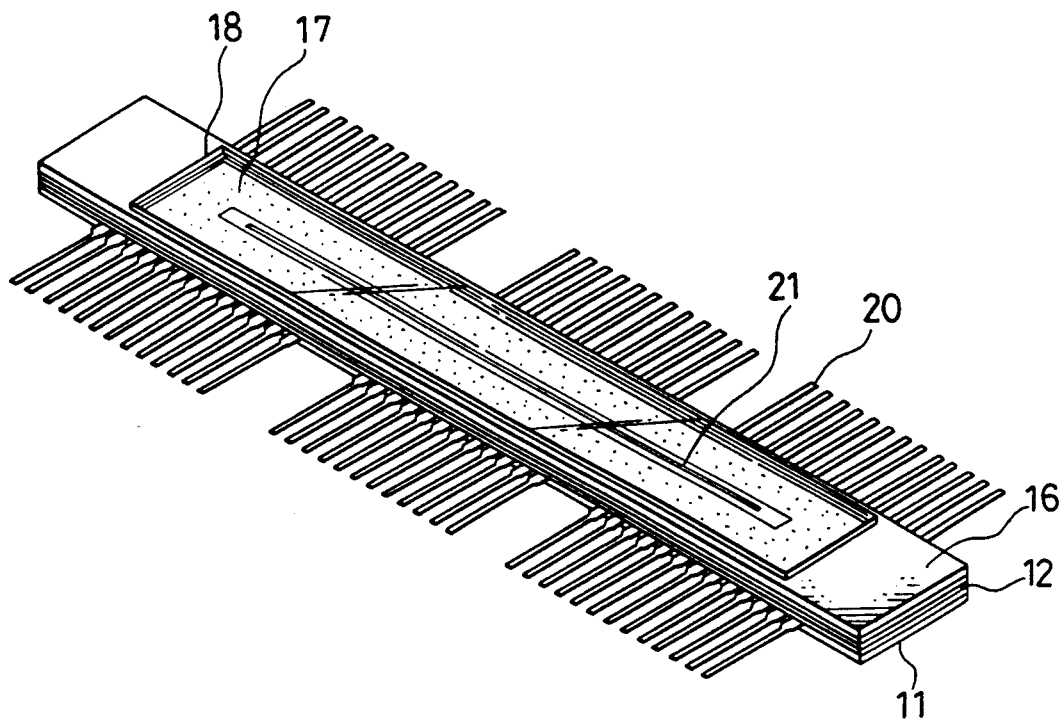
FIG. 1 is a perspective view showing a semiconductor device in accordance with a first embodiment of the present invention.
Figure 2:
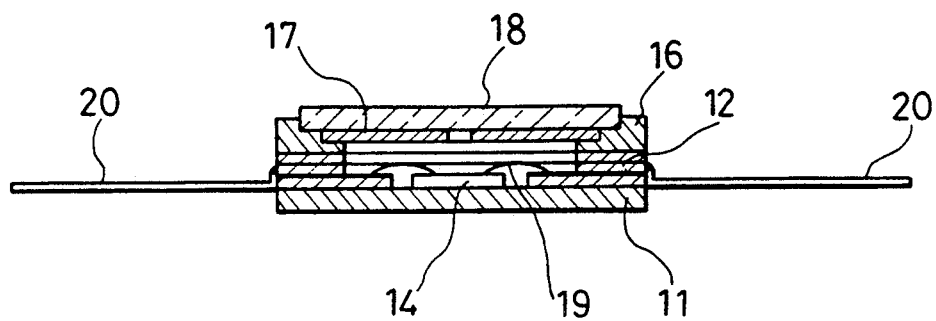
FIG. 2 is a sectional view of FIG. 1.
Figure 3:
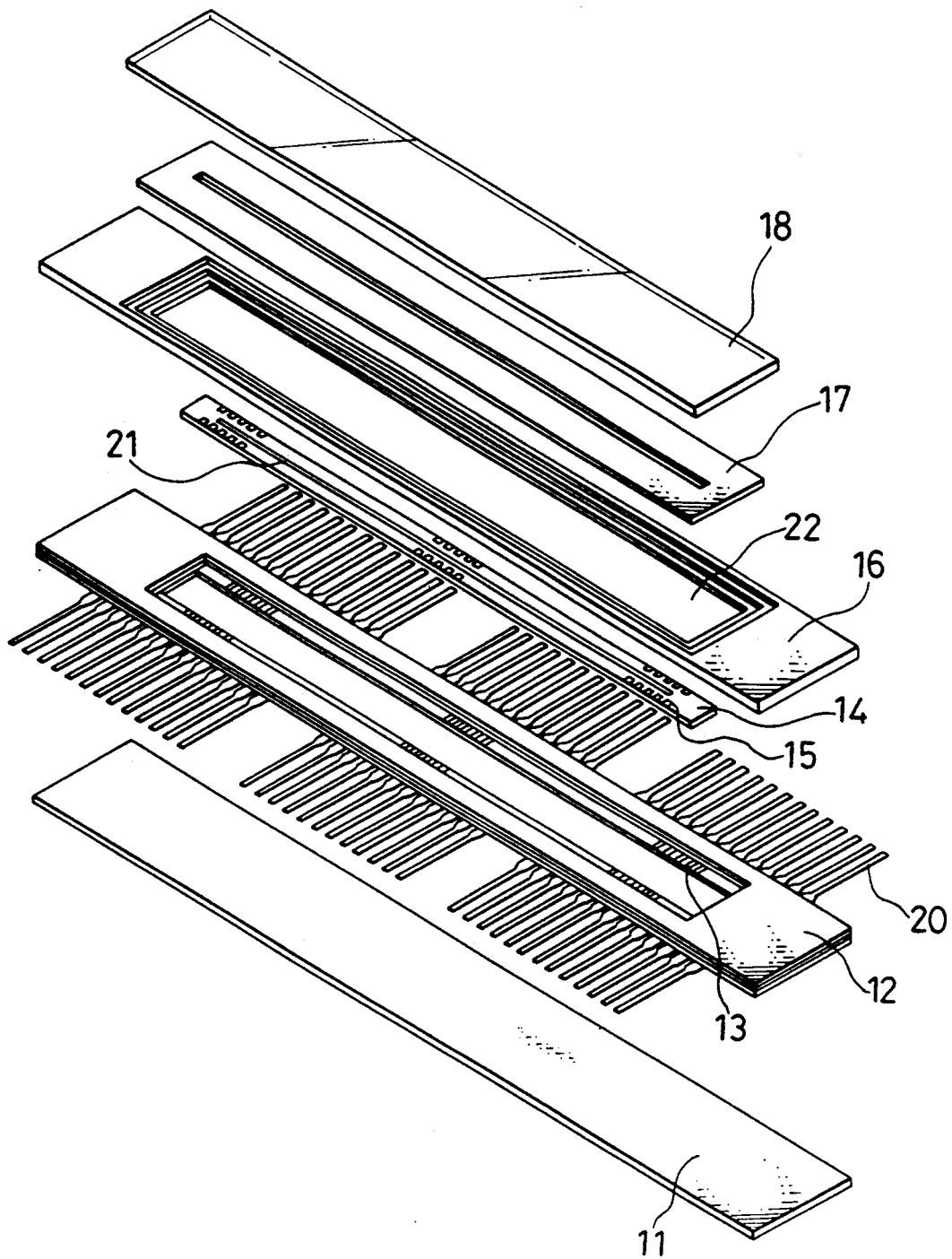
FIG. 3 is an exploded perspective view of FIG. 1.

FIG. 1 is a perspective view showing a semiconductor device in accordance with a first embodiment of the present invention and FIGS. 2 and 3 are a sectional view and an exploded perspective view showing the same, respectively. In the drawings, reference numeral 11 designates a lower plate with a thickness of 1 mm which is formed of silicon carbide (SiC : coefficient of linear expansion is $3.7 \times 10^{-6}$ {°K$^{-1}$}) and reference numeral 12 designates a middle plate having an inner lead 13 and formed of alumina (Al$_2$O$_3$; coefficient of linear expansion is $6.8 \times 10^{-6}$ (°K$^{-1}$)). The middle plate comprises three laminated layers each having a thickness of 0.5 mm. Reference numeral 14 designates an image sensor chip with a thickness of 0.625 mm comprising a solid-state imaging device made of silicon (Si; coefficient of linear expansion is $3.04 \times 10^{-6}$ {°K$^{-1}$}). It has a bonding pad 15 and a bonded on the lower plate 11. Reference numeral 16 is an upper plate with a thickness of 1.5 mm, formed of silicon carbide bonded on the middle plate 12. Reference numeral 17 designates a light shielding plate formed of stainless steel with a thickness of approximately 0.2 mm which is plated with delustering chrome and set in a frame-shaped trench on the upper plate 16. Reference numeral 18 designates a glass lid with a thickness of 1 mm which seals the frame part of the upper plate 16. Reference numeral 19 designates an aluminum wire with a diameter of 30 μm which connects the pad 15 on the image sensor chip 14 to the inner lead 13 on the middle plate 12 and reference numeral 20 designates an outer lead bonded to the middle plate 12. In addition, reference numeral 21 designates an image area formed on the image sensor chip and reference numeral 22 designates a rectangular opening for incident light provided at the upper plate 16.

The middle plate 12 has a three layer structure and these three layers are baked together to be one plate. Each of the upper plate 16, the middle plate 12 and the lower plate 11 is mirror-ground on both surfaces and has a flatness of 20—50 μm over the whole surface. Then, the glass lid 18 and the upper plate 16, the upper plate 16 and the middle plate 12, the middle plate 12 and the lower plate 11, and the image sensor chip 14 and the lower plate 11 are bonded by solder or an adhesive material such as a resin, respectively, so that they are integrally formed. Mirror grinding prevents the plate from curving before bonding and reduces the amount of the adhesive material used in bonding.

Next, operation thereof will be described in detail.

Incident light from an upper surface of the device passes through the glass lid 18. Then, some light passes through the opening in the light shielding plate 17 and then reaches the image area 21 on the image sensor chip 14. Then, an image signal is converted to an electric signal. This electric signal is output to the outer lead 20 through the pad 15, the wire 19, the inner lead 13 and the multiple-layer wiring (not shown) of the middle plate 12 made of alumina.

According to a structure of this embodiment, the lower plate 11 and the upper plate 16 are formed of silicon carbide which has a coefficient of linear expansion very close to that of silicon which constitutes the chip 14. They are bonded at a high temperature with the middle plate serving as a wiring board therebetween and cooled to room temperature (25° C.). The of shrinkage force on one side of the middle plate caused by a temperature difference due to cooling is the same as at the other side because the upper plate 16 and the lower plate 11 have the same coefficient of linear expansion, with the result that the curvature of the surface of the chip 14 is reduced.

Figure 15:
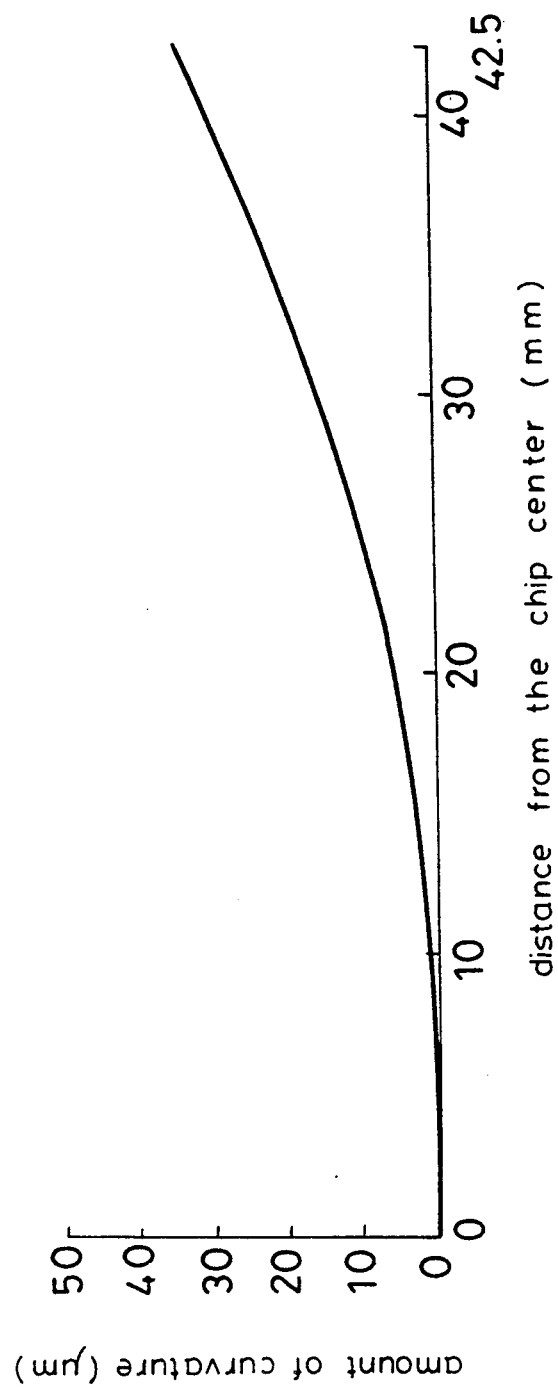
FIG. 15 is a graph showing the curvature of a chip surface of a semiconductor device in accordance with the first embodiment of the present invention.
Figure 16:
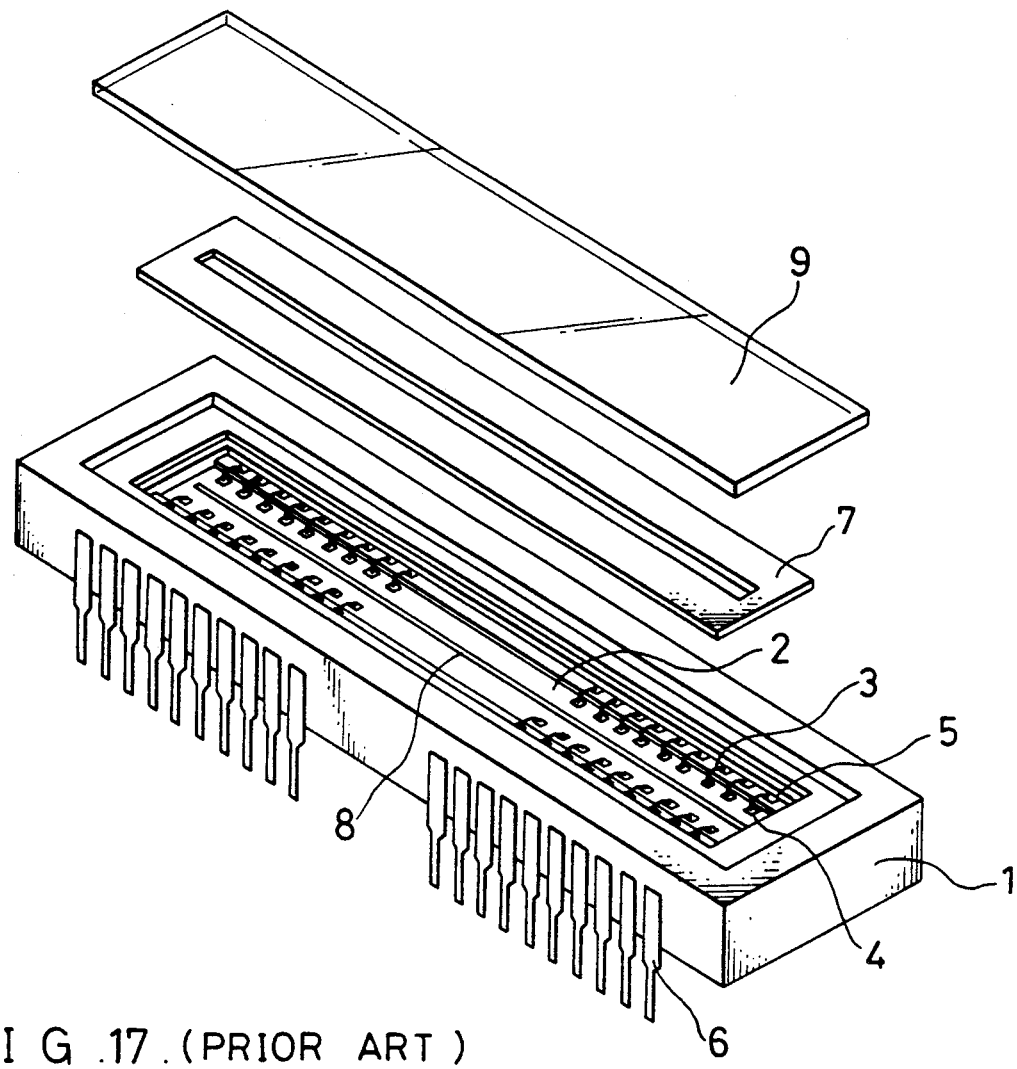
FIG. 16 is a partially exploded perspective view showing a conventional semiconductor device.
Figure 17:
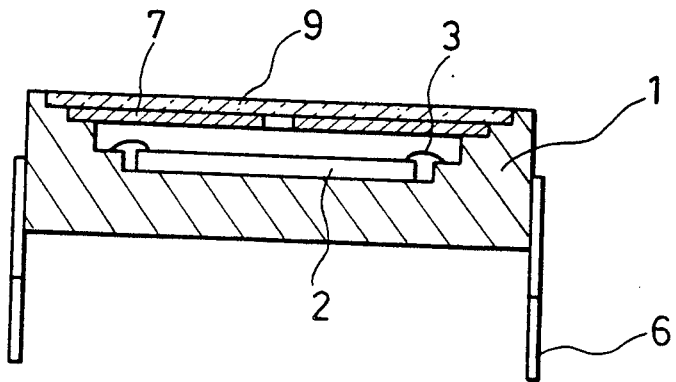
FIG. 17 is a sectional view of FIG. 16.
Figure 18:
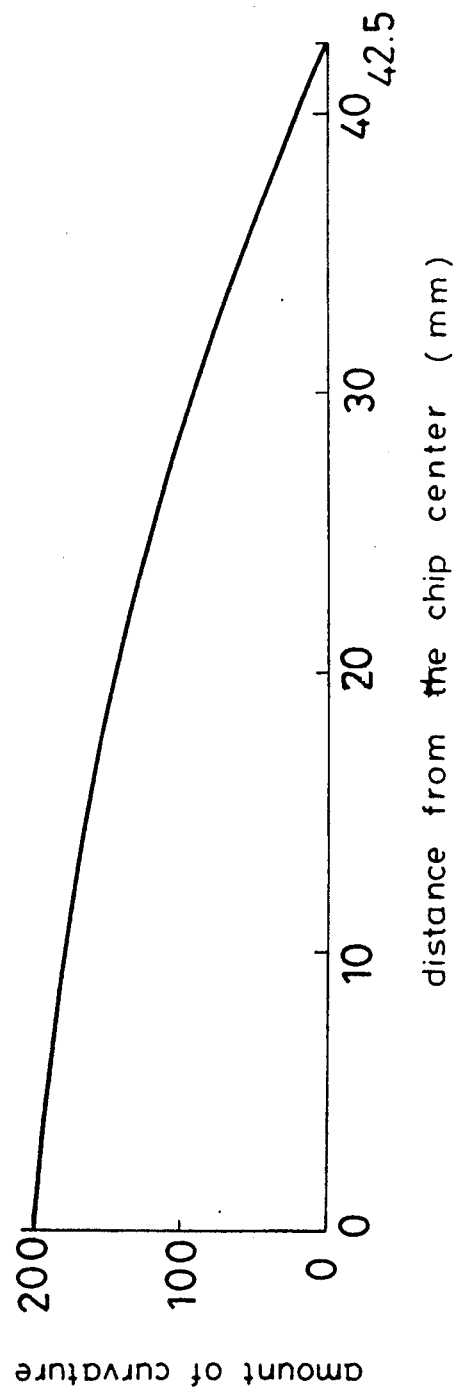
FIG. 18 is a graph showing the curvature of a chip surface of a conventional semiconductor device.

FIG. 15 shows a result of simulation of the relation between an amount of curvature of the surface of the chip 14 and a distance from the center of the chip 14. As shown in FIG. 15, in case of a chip with a length of 85 mm, the amount of curvature of the chip surface in a longitudinal direction is reduced to approximately 35 μm. The curvature of the chip is caused because the upper plate 16 has a window 22 for incident light and there is generated imbalance between the upper plate 16 and the lower plate 11. However, in this structure, curvature of approximately 35 μm is almost no problem when light from an optical system focuses on the chip 14 and the device operates normally. In addition, since the amount of curvature is small, the internal stress of the chip is reduced and reliability against heat cycling is improved.

Figure 4:
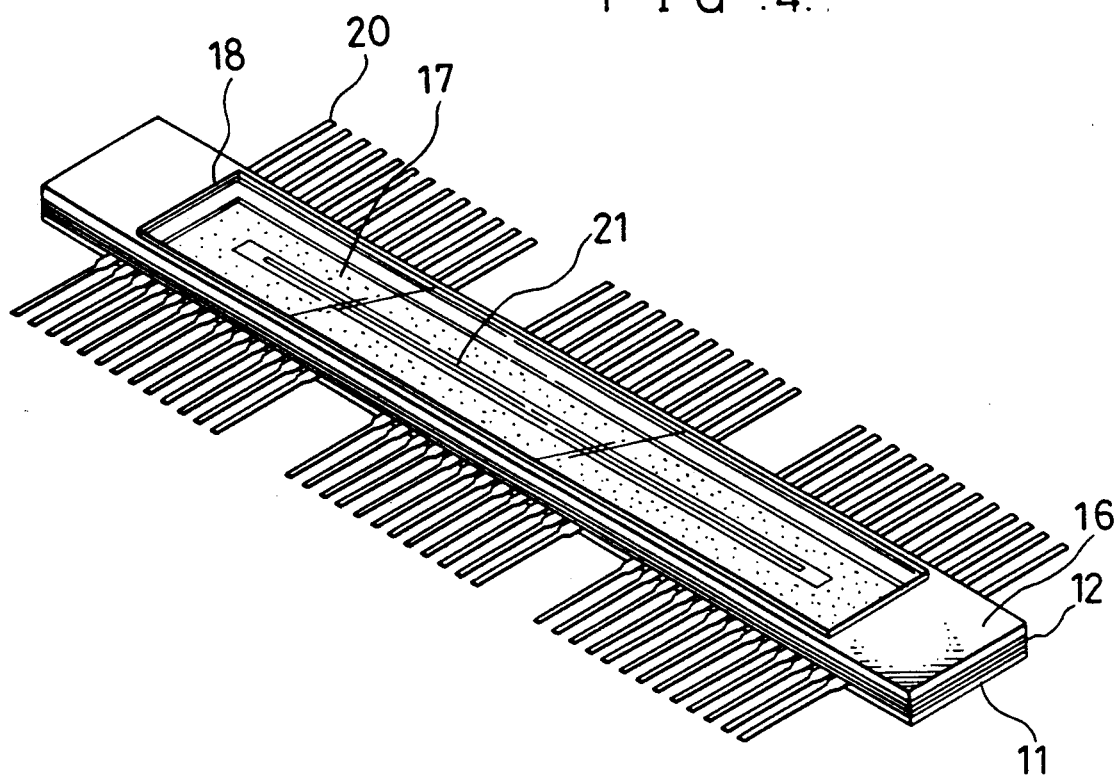
FIG. 4 is a perspective view showing a semiconductor device in accordance with a second embodiment of the present invention.
Figure 5:
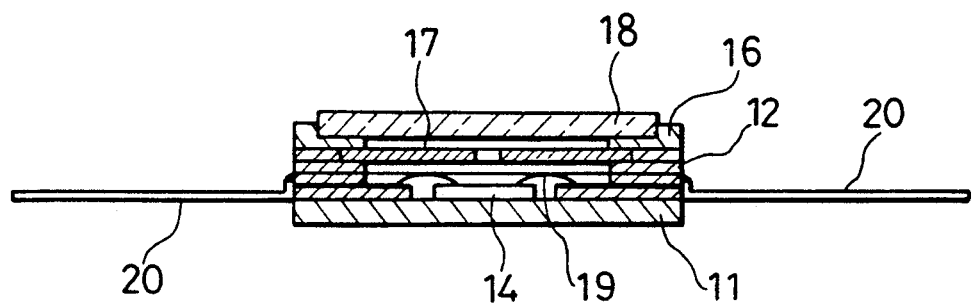
FIG. 5 is a sectional view of FIG. 4.
Figure 6:
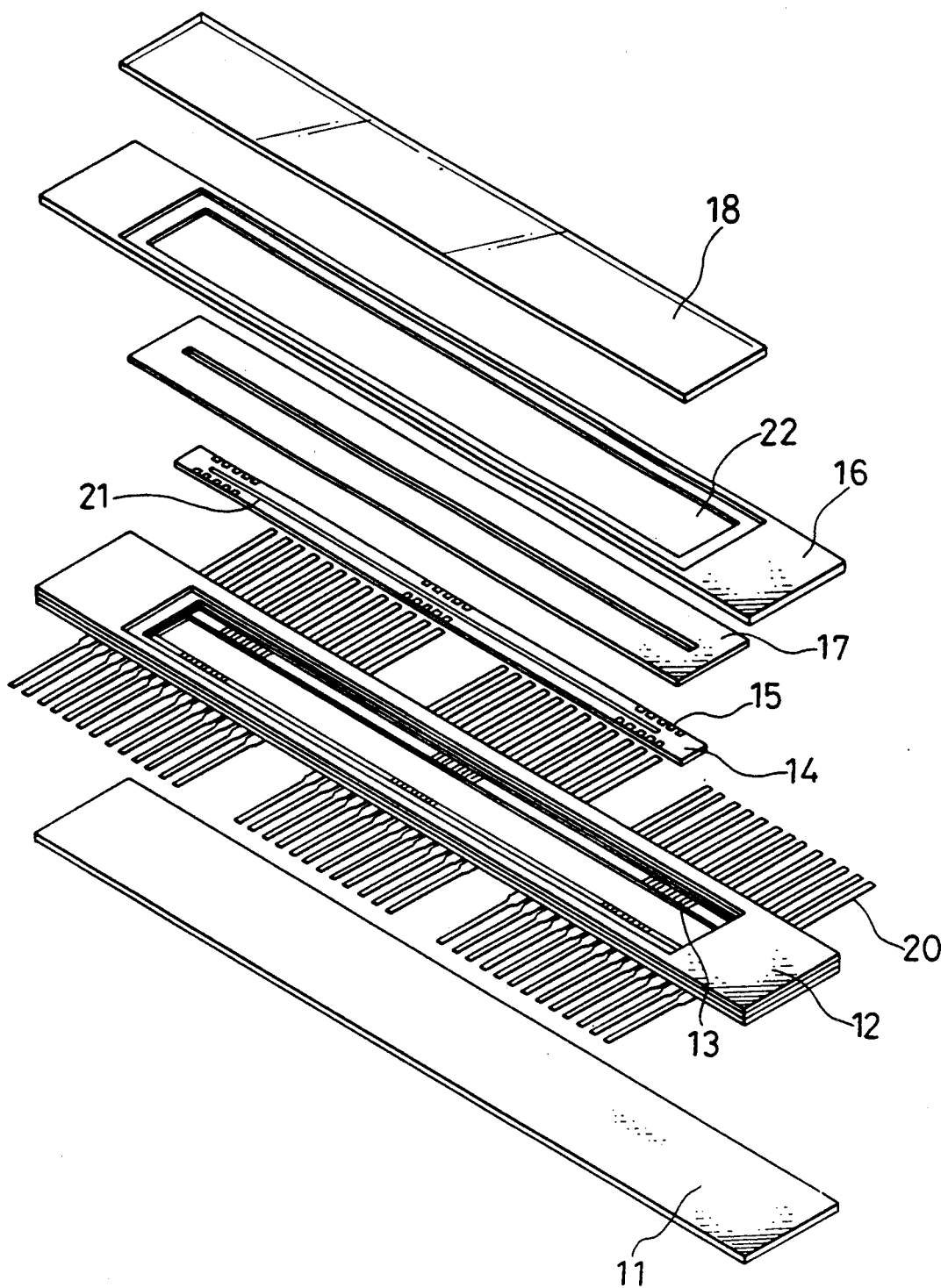
FIG. 6 is an exploded perspective view of FIG. 4.

Although the light shielding plate 17 is set in the trench on the upper plate 16 in this embodiment, it may be set in a trench formed on the middle plate 12. FIGS. 4, 5 and 6 respectively show a perspective view, a sectional view and an exploded perspective view showing a structure of a semiconductor device in accordance with a second embodiment of the present invention. In these figures, the same reference numbers as in FIG. 1 designate the same parts. According to this embodiment, since the light shielding plate 17 is set on the middle plate 12, more specifically, on a top layer of the middle plate, the chip 14 can be arranged in the vicinity of the light shielding plate 17 no light is incident other than on the image area 21 on the chip 14, so that stray light can be reduced. As a result, performance of the device can be further improved.

Figure 7:
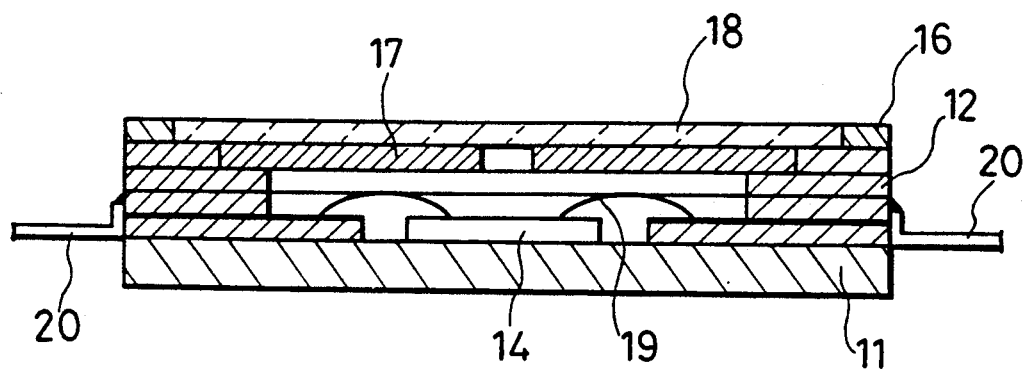
FIG. 7 is a sectional view of a semiconductor device in accordance with a third embodiment of the present invention.

Although the light shielding plate 17 on the middle plate 12 and the glass lid 18 on the upper plate 16 are separately formed in the second embodiment, these can be formed in contact with each other. FIG. 7 is a sectional view showing a semiconductor device in accordance with a third embodiment of the present invention. In FIG. 7, the same reference numbers as in FIG. 5 designate the same parts. According to this embodiment, the glass lid 18 on the frame of the upper plate 16 is in contact with the light shielding plate 17 set on the top layer of the middle plate 12. In this embodiment, the weight of the device can be reduced and the device can be highly integrated, in addition to the advantages of the second embodiment.

Figure 8:
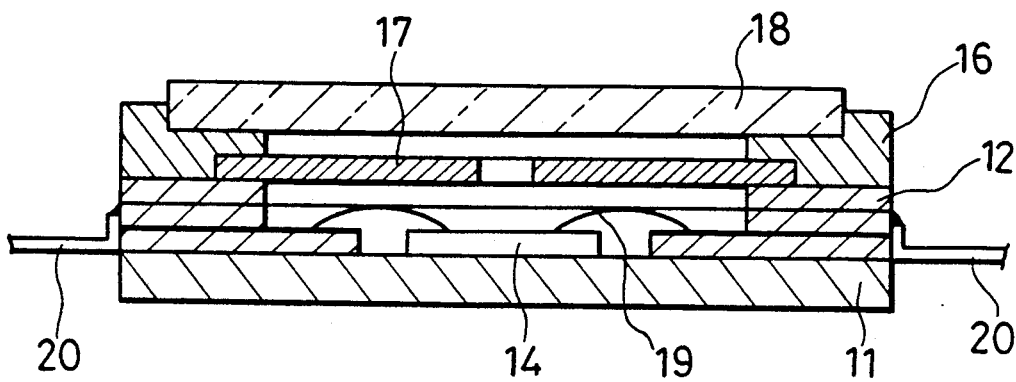
FIG. 8 is a sectional view of a semiconductor device in accordance with a fourth embodiment of the present invention.

Although the glass lid 18 and the light shielding plate 17 are in contact with each other in the upper plate 16 in the first embodiment, the light shielding plate 17 may be set in a trench formed on a lower surface of the upper plate 16 spaced from the glass lid 18 and it may be provided in the vicinity of the chip 14 as shown in FIG. 8 showing a fourth embodiment of the present invention.

Figure 9:
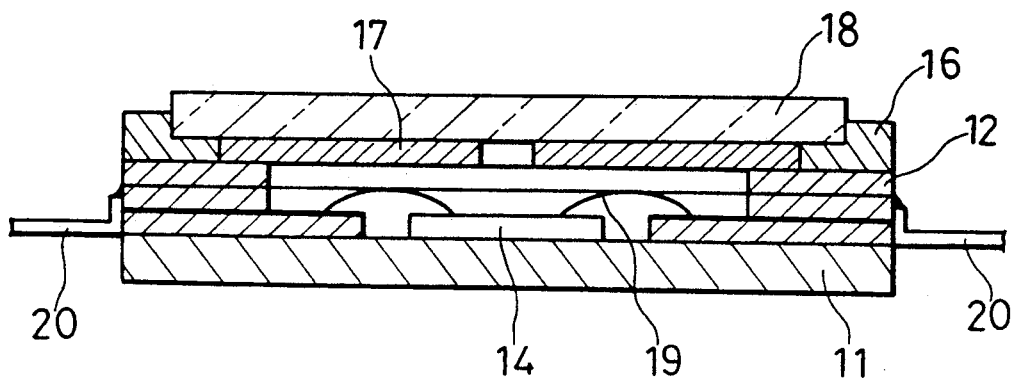
FIG. 9 is a sectional view of a semiconductor device in accordance with a fifth embodiment of the present invention.

Alternatively, besides the structure shown in FIG. 8, the glass lid 18 may be in contact with the light shielding plate 17 set in the bottom surface of the upper plate 16 as shown in FIG. 9 showing a fifth embodiment of the present invention. As a result, the weight of the device is reduced and the device can be highly integrated.

Figure 10:
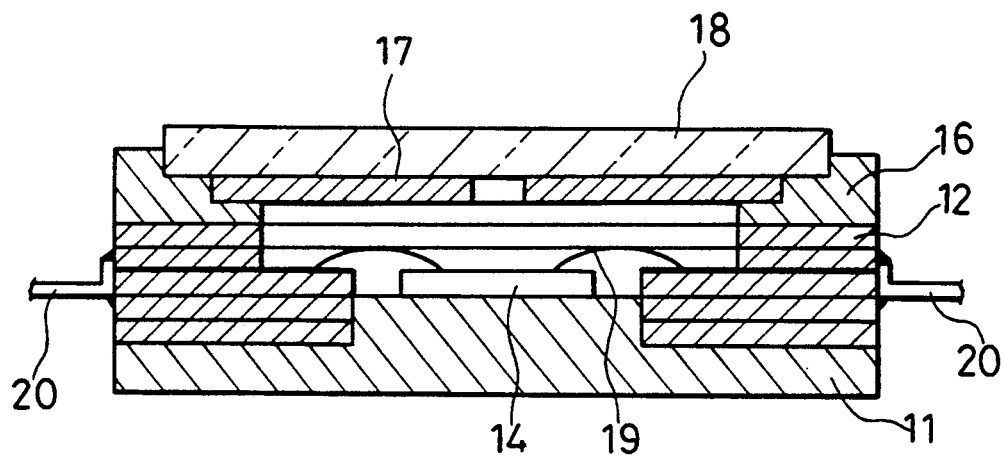
FIG. 10 is a sectional view of a semiconductor device in accordance with a sixth embodiment of the present invention.

In a case where it is necessary to increase an area of a brazing material at a root of the outer lead 20 bonded to the middle plate 12, the middle plate 12 should be thickly formed and have five layers. A die pad of the lower plate 11 may project toward upper plate 16 as shown in FIG. 10 showing a sixth embodiment of the present invention. The die pad part of the lower plate 11 projects in order to easily perform wire bonding of the chip 14. In this embodiment, since the area for brazing the outer lead 20 is increased, the tensile stress of the outer lead 20 is increased, with the result that reliability of the device is greatly improved.

Figure 11:
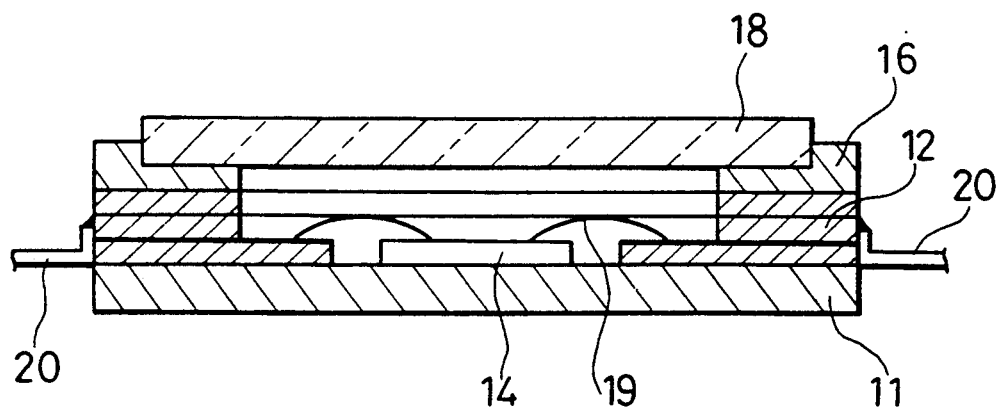
FIG. 11 is a sectional view of a semiconductor device in accordance with a seventh embodiment of the present invention.

When light interception is not necessary in the image sensor, the light shielding plate may be dispensed with as shown in FIG. 11 showing a seventh embodiment of the present invention.

Figure 12:
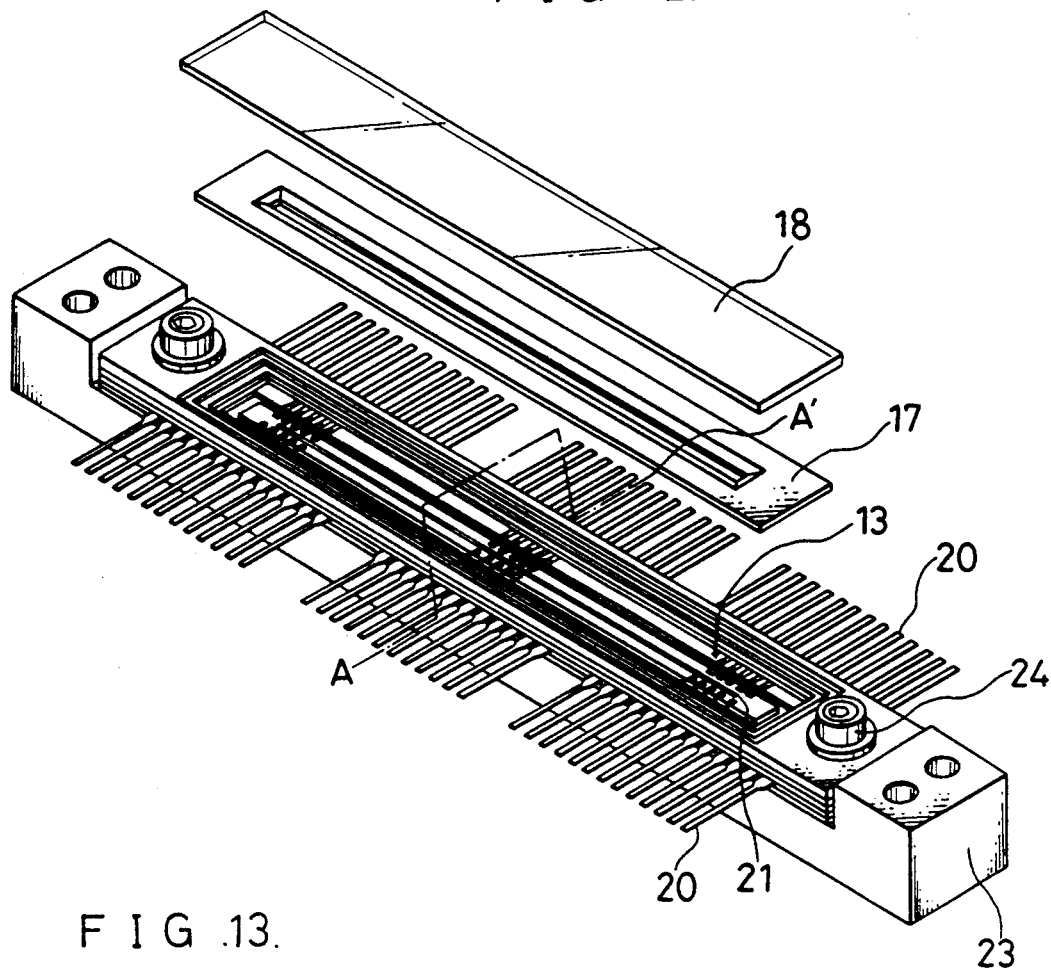
FIG. 12 is an exploded perspective view showing a semiconductor device in accordance with an eighth embodiment of the present invention.
Figure 13:
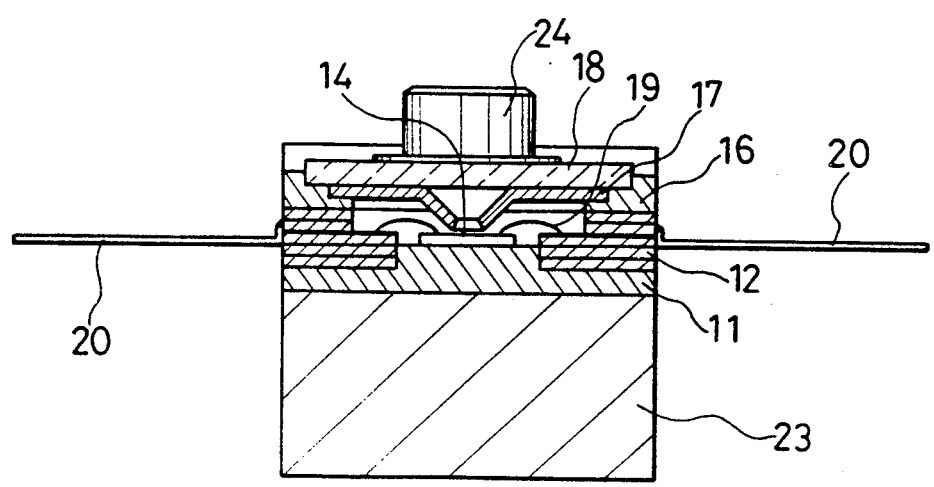
FIG. 13 is a sectional view taken along a line A—A' in FIG. 12.
Figure 14:
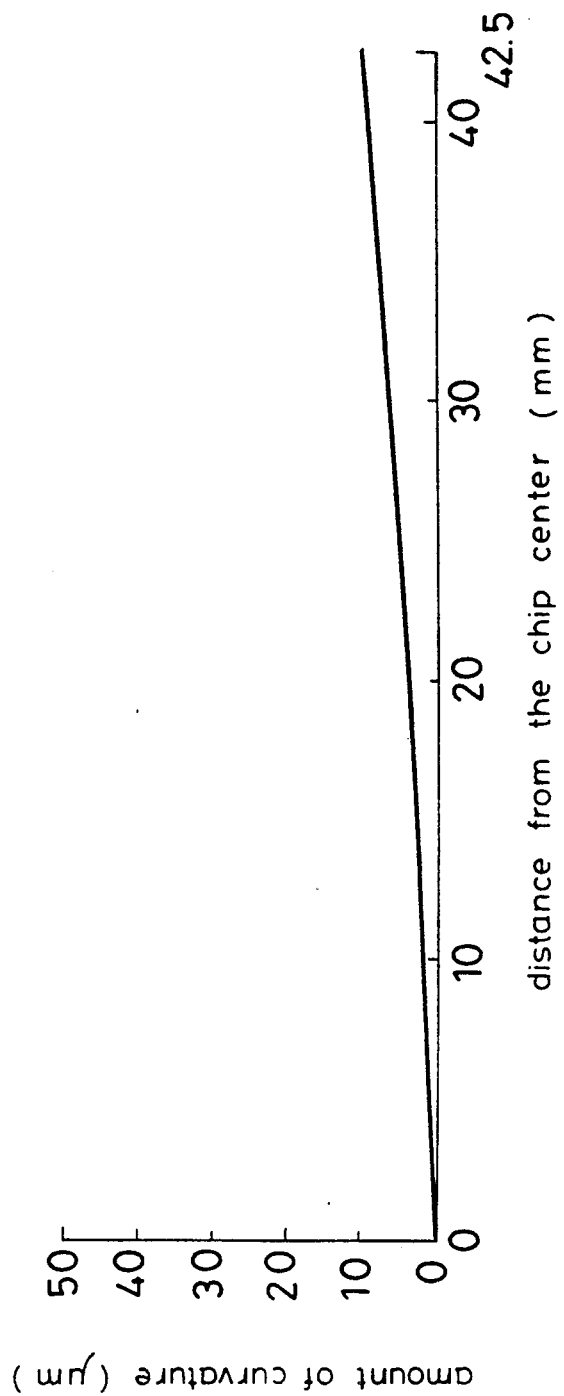
FIG. 14 is a graph showing the curvature of a chip surface of a semiconductor device in accordance with the eighth embodiment of the present invention.

It may be necessary to further reduce the amount of curvature of the chip surface. FIG. 12 shows an eighth embodiment of the present invention and FIG. 13 is a sectional view taken along a line A—A' in FIG. 12. The semiconductor device in accordance with the present invention is positioned on a block 23, a surface thereof in contact with a back surface of a package being planar, and the semiconductor device is clamped to the block 23 by bolts 24 through holes on both ends of the package. As a result, the curvature can be deformed. According to this method, as shown in FIG. 14, the amount of curvature of the chip surface can be reduced to approximately 10 $\mu$m or less and curvature in the longitudinal direction of the chip is almost eliminated. Therefore, the semiconductor device in accordance with this embodiment has a very small internal stress and high reliability against heat cycling and the like as compared with with the first to seventh embodiments. Especially, the device in accordance with this embodiment is effective when this is used for a space environment, such as an artificial satellite which requires high performance.

Although silicon carbide is used as the material of the lower plate 11 and the upper plate 16 in the above embodiments, an opaque, electrically insulating material of high mechanical strength and having a coefficient of thermal expansion close to that of the material constituting the chip, for example aluminum nitride (AlN; coefficient of linear expansion is $4.3\times10^{-6}\{°K^{-1}\}$) and the like may be used. In addition, the lower plate 11 and the upper plate 16 are not necessarily the same material and, for example the lower plate 11 may be silicon carbide and the upper plate 16 may be aluminum nitride, and vice versa.

Although multiple layer alumina is used as the middle plate 12 in above-described embodiments, the material and the number of layers of the middle plate is not limited to this structure and, for example black aluminum nitride and the like may be used.

Although the glass lid is used as the lid 18 for an upper part of the frame on the upper plate in the above embodiments, a transparent synthetic resin plate may be used for it.

In addition, although a linear image sensor is used as the semiconductor chip to be packaged in the above embodiments, an area image sensor may be used, which has the same effect.

Although the flat type outer lead is shown in the above embodiments, this may be a dual in-line type, leadless type or leaded chip carrier type.

According to the present invention, a semiconductor device which responds to light comprises a lower plate and an upper plate formed of silicon carbide or aluminum nitride, a semiconductor chip mounted on the lower plate, and a middle plate comprising a single or a plurality of layers of wiring board through which the upper plate and the lower plate are bonded. The upper frame part of the upper plate is sealed by a lid made of glass or a synthetic resin and light is incident through an opening provided in the upper plate. As a result, in the thus structured semiconductor device, there is almost no curvature in the longitudinal direction of the semiconductor chip such as a long image sensor chip at room temperature, internal stress is small and performance and reliability are high. In addition, when a block is provided on a lower surface of the semiconductor device and the semiconductor device is fixed to this block, curvature in the longitudinal direction of the semiconductor chip is further reduced. As a result, there can be provided a semiconductor device having very high performance in which internal stress is small and reliability against a heat cycling is high.

Although the present invention has been described and illustrated in detail, it is clearly understood that the same is by way of illustration and example only and is not to be taken by way of limitation, the present invention being limited only by the appended claims.

What is claimed is:

1. A packaged semiconductor device comprising:
   a semiconductor chip responsive to light and including a plurality of pads for making electrical connections to said chip; and
   a package including:
   an opaque, electrically insulating lower plate having a coefficient of thermal expansion substantially the same as that of said semiconductor chip, said lower plate including a central protrusion on which said semiconductor chip is bonded and a peripheral flange surrounding said central protrusion;
   a middle plate comprising at least first and second laminated plates, said first plate including three layers and having opposed first and second surfaces and a first central opening, a plurality of inner leads disposed on said first surface proximate the first central opening, and a plurality of outer leads projecting from said first plate outside and mechanically attached to said package, said outer leads being electrically connected to respective inner leads, said second surface being bonded to said peripheral flange of said lower plate abutting said central protrusion, said second plate being bonded to said first surface of said first plate and including two layers and a second central opening larger than the first central opening exposing said inner leads on said first surface;
   wires interconnecting respective inner leads and pads;
   an opaque, electrically insulating upper plate having a coefficient of thermal expansion substantially the same as that of said semiconductor chip, bonded to said middle plate opposite the lower plate, said upper plate including a central opening for admitting light to said semiconductor chip; and a lid that transmits light bonded to said upper plate and sealing the central opening of said upper plate.

2. A packaged semiconductor device in accordance with claim 1 including a light shielding plate disposed within said package adjacent said upper plate and having a central opening for transmitting light, the central opening being disposed opposite said semiconductor chip.

3. A packaged semiconductor device in accordance with claim 1 wherein said upper, middle, and lower plates have aligned holes for receiving a bolt, and including a block having a planar surface including at least one threaded hole for engaging a bolt, said lower plate contacting said block and including a bolt passing through the holes in said upper, middle, and lower plates and engaging the threaded hole in said block, clamping said upper, middle, and lower plates against deformation.

4. A packaged semiconductor device in accordance with claim 1 wherein said semiconductor chip is silicon, said upper and lower plates are a material selected from the group consisting of silicon carbide and aluminum nitride, and said middle plate is alumina.

* * * * *